(12) United States Patent
Chang et al.

(10) Patent No.: US 11,450,749 B2
(45) Date of Patent: Sep. 20, 2022

(54) ELECTRODE STRUCTURE FOR VERTICAL GROUP III-V DEVICE

(71) Applicant: Taiwan Semiconductor Manufacturing Co., Ltd., Hsin-Chu (TW)

(72) Inventors: Yao-Chung Chang, Zhubei (TW); Chun Lin Tsai, Hsin-Chu (TW); Ru-Yi Su, Kouhu Township (TW); Wei Wang, Hsin-Chu (TW); Wei-Chen Yang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 45 days.

(21) Appl. No.: 16/884,292

(22) Filed: May 27, 2020

(65) Prior Publication Data
US 2021/0376090 A1 Dec. 2, 2021

(51) Int. Cl.
*H01L 29/417* (2006.01)
*H01L 29/66* (2006.01)
*H01L 29/20* (2006.01)
*H01L 29/205* (2006.01)
*H01L 29/778* (2006.01)
*H01L 29/868* (2006.01)

(52) U.S. Cl.
CPC ...... *H01L 29/417* (2013.01); *H01L 29/41741* (2013.01); *H01L 29/6609* (2013.01);
(Continued)

(58) Field of Classification Search
CPC ............. H01L 29/417; H01L 29/41741; H01L 29/6609; H01L 29/2003; H01L 29/205;
(Continued)

(56) References Cited

U.S. PATENT DOCUMENTS

2015/0311382 A1* 10/2015 Kim ................. H01L 33/04
257/13
2016/0322466 A1* 11/2016 Simin ............... H01L 29/6609
(Continued)

FOREIGN PATENT DOCUMENTS

CN 102386222 A * 3/2012 .......... H01L 29/207

OTHER PUBLICATIONS

Mikolajick et al. "From Bulk Gallium Nitride Material to Vertical GaN Devices." Semicon Europa, published on Nov. 14, 2017.
(Continued)

*Primary Examiner* — Shahed Ahmed
(74) *Attorney, Agent, or Firm* — Eschweiler & Potashnik, LLC

(57) ABSTRACT

Various embodiments of the present disclosure are directed towards a semiconductor structure including a buffer layer disposed between an active layer and a substrate. The active layer overlies the substrate. The substrate and the buffer layer include a plurality of pillar structures that extend vertically from a bottom surface of the active layer in a direction away from the active layer. A top electrode overlies an upper surface of the active layer. A bottom electrode underlies the substrate. The bottom electrode includes a conductive body and a plurality of conductive structures that respectively extend continuously from the conductive body, along sidewalls of the pillar structures, to a lower surface of the active layer.

20 Claims, 12 Drawing Sheets

(52) U.S. Cl.
CPC ........ *H01L 29/2003* (2013.01); *H01L 29/205* (2013.01); *H01L 29/7788* (2013.01); *H01L 29/868* (2013.01)

(58) Field of Classification Search
CPC ............... H01L 29/7788; H01L 29/868; H01L 29/778–7789; H01L 29/122–127; H01L 29/15–158; H01L 2924/12031; H01L 29/20–2006
See application file for complete search history.

(56) References Cited

U.S. PATENT DOCUMENTS

| | | | |
|---|---|---|---|
| 2019/0051740 A1* | 2/2019 | Okamoto | H01L 29/4232 |
| 2021/0225836 A1* | 7/2021 | Roig-Guitart | H02M 3/003 |
| 2021/0264959 A1* | 8/2021 | Rabkin | H01L 29/778 |

OTHER PUBLICATIONS

Huang et al. "Gallium Nitride Normally-Off Vertical Field-Effect Transistor Featuring an Additional Back Current Blocking Layer Structure." Electronics 2019, 8, 241; doi:10.3390/electronics8020241, published on Feb. 20, 2019.

Cooke, Mike. "First Demonstration of Fully Vertical Gallium Nitride Transistors on Silicon." Semiconductor Today, published on Feb. 21, 2019.

Zhao et al. "Electronic, Magnetic, Superconducting, and Neuromorphic Devices." MTL Annual Research Report, published in 2018.

Cooke, Mike. "Platform for Fully Vertical Gallium Nitride on Silicon Power Devices." Semiconductor Today, published an Apr. 26, 2018.

Zhang et al. "GaN Power Devices: Perfecting the Vertical Architecture." Compound Semiconductor, vol. 23 Issue 7, published on Oct. 30, 2017.

\* cited by examiner

ELECTRODE STRUCTURE FOR VERTICAL GROUP III-V DEVICE

BACKGROUND

Semiconductor devices based on silicon, such as transistors and photodiodes, have been the standard for the past three decades. However, semiconductor devices based on alternative materials are receiving increasing attention. For example, semiconductor devices based on group III-V semiconductor materials have found widespread use in high power applications. This is because the high electron mobility and low temperature coefficients of group III-V semiconductor materials allow it to carry large currents and support high voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
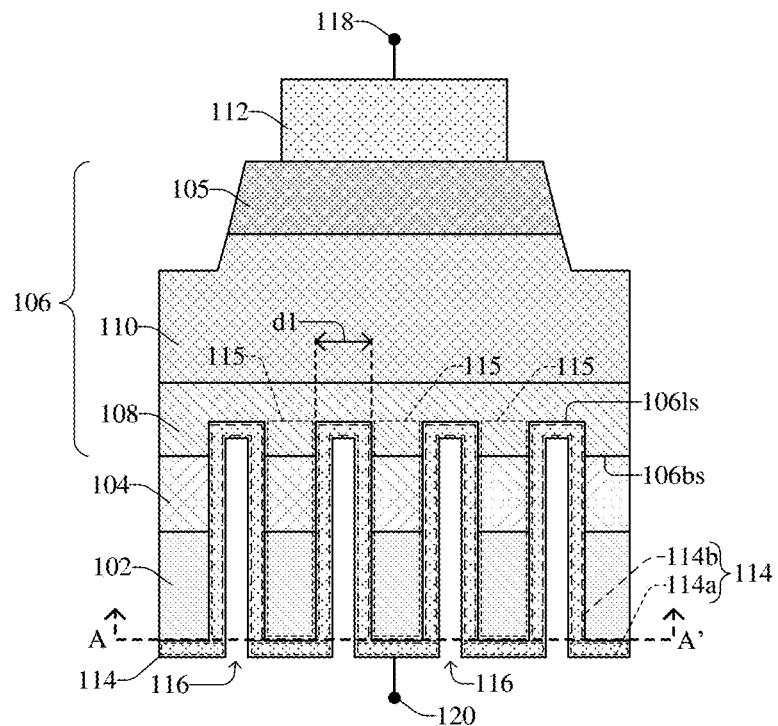
FIG. 1 illustrates a cross-sectional view of some embodiments of a semiconductor device having an active layer disposed between a top electrode and a bottom electrode.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Group III-V devices are often formed on a silicon substrate. Among other things, silicon substrates are cheap and readily available in a wide variety of sizes. A group III-V device formed on a silicon substrate may comprise a buffer layer overlying the silicon substrate, and an active layer overlying the buffer layer. The silicon substrate may have a crystalline orientation of (111) and contacts the buffer layer. The buffer layer may comprise aluminum gallium nitride and serves as a seed layer for forming an overlying layer (e.g., the active layer that may comprise gallium nitride). The active layer overlies the buffer layer and may comprise one or more doped regions, such that the group III-V device is configured as a transistor, a diode, etc. A top electrode contacts an upper surface of the active layer. At least a portion of the buffer layer and the silicon substrate are removed to expose a lower surface of the active layer, such that a bottom electrode may be disposed along the lower surface of the active layer. This facilitates the bottom electrode having an ohmic contact with the active layer.

Group III-V devices can be formed in a number of different ways. For example, the buffer layer may be formed over the silicon substrate and the active layer may be formed over the buffer layer. As the active layer is formed over the buffer layer, a lattice constant of the active layer will conform to a lattice constant of the buffer layer, such that the active layer has a strained lattice constant after forming it on the buffer layer (e.g., the active layer will have a shorter lattice constant). The strained lattice constant may increase a mobility of charge carriers (e.g., electrons and/or holes) across the active layer. Further, the die may be rotated and subsequently bonded to a bottom electrode that overlies a carrier substrate, such that a lower surface of the active layer contacts the bottom electrode. A removal process may be performed to remove the silicon substrate and the buffer layer, thereby exposing an upper surface of the active layer. Finally, a top electrode is formed along the upper surface of the active layer. However, in such configurations, the process is complex and removing the buffer layer may relax the strained lattice constant of the active layer, thereby inducing dislocations in the active layer. This in turn may increases time and cost associated with forming the group III-V device and/or reduce a performance of the group III-V device. In another example, after forming the active layer over the buffer layer, a top electrode may be formed along an upper surface of the active layer. Subsequently, the silicon substrate and buffer layer are etched until a lower surface of the active layer is exposed, thereby forming a relatively large and continuous opening in the buffer layer and silicon substrate. Finally, a bottom electrode is formed along the lower surface of the active layer and lines the opening. However, the etching process that forms the opening results in a relaxation of the strained lattice constant of the active layer in a region aligned with the opening. This in turn may induce dislocations across a width of the bottom electrode within the active layer that may extend through an entire thickness of the active layer, thereby reducing a performance of the group III-V device (e.g., reduce a breakdown voltage of the group III-V device).

Accordingly, the present disclosure relates to a group III-V device having a bottom electrode that extends along a plurality of sidewalls defined within the buffer layer and silicon substrate to contact a lower surface of the active layer. In some embodiments, the group III-V device includes an active layer overlying a buffer layer and a silicon substrate underlying the buffer layer. The active layer is formed on the buffer layer in such a manner as to have a strained lattice constant. A top electrode extends along an upper surface of the active layer. The buffer layer and silicon substrate comprise a plurality of pillars that are laterally offset from one another by a plurality of openings that extend through the buffer layer and silicon substrate. A bottom electrode extends continuously along the pillars and across a lower surface of the active layer, such that the bottom electrode forms an ohmic contact with the active layer. The plurality of pillars within the buffer layer and silicon substrate may prevent and/or mitigate a relaxation of the strained lattice constant of the active layer across a width of the bottom electrode. This in turn mitigates and/or eliminates dislocation in the active layer, thereby increasing a performance of the group III-V device while reducing a complexity of fabricating the group III-V device.

FIG. 1 illustrates a cross-sectional view of some embodiments of a semiconductor structure 100 having an active layer 106 disposed over a substrate 102.

In some embodiments, the semiconductor structure 100 may be configured as a group III-V device. For example, in some embodiments, the group III-V device may be configured as a diode. The substrate 102 may, for example, be or comprise monocrystalline silicon, silicon carbide, or some other semiconductor material, and/or may, for example have a crystalline orientation of (111) or some other crystalline orientation. A buffer layer 104 overlies the substrate 102 and comprises a first group III-V material (e.g., $Al_xGa_{1-x}N$, where x is within a range of 0 to 1). The active layer 106 overlies the buffer layer 104 and comprises a second group III-V material (e.g., gallium nitride). In some embodiments, the first group III-V material is different from the second group III-V material.

The buffer layer 104 may, for example, serve to compensate for a different in lattice constants, crystalline structures, thermal expansion coefficients, or any combination of the foregoing between the substrate 102 and the active layer 106. In some embodiments, the active layer 106 may be epitaxially grown such that the active layer 106 comprises a strain in its crystal lattice. The strain may, for example, increase a mobility of charge carriers (e.g., electrons and/or holes) within the active layer 106, thereby increasing a performance of the group III-V device. The buffer layer 104 facilitates forming and maintaining the strain in the crystal lattice of the active layer 106.

In some embodiments, the active layer 106 comprises a first doped region 105, a second doped region 108, and an undoped region 110 disposed vertically between the first and second doped regions 105, 108. In some embodiments, the first doped region 105 may comprise a first doping type (e.g., p-type) and the second doped region 108 may comprise a second doping type (e.g., n-type) opposite the first doping type. In further embodiments, the first doping type is p-type and the second doping type is n-type, or vice versa. In some embodiments, the undoped region 110 may be undoped, such that the undoped region 110 may, for example, be or comprise intrinsic gallium nitride. A top electrode 112 overlies the active layer 106 and a bottom electrode 114 underlies the active layer 106. In some embodiments, the top electrode 112 directly contacts the first doped region 105. In some embodiments, a first node 118 is electrically coupled to the top electrode 112 (e.g., by way of conductive wires and/or vias (not shown)) and a second node 120 is electrically coupled to the bottom electrode 114 (e.g., by way of conductive wires and/or vias (not shown)). During operation of the group III-V device, appropriate bias conditions are applied to the first and second nodes 118, 120 such that charge carriers (e.g., holes or electrons) may travel across the active layer 106 from the top electrode 112 to the bottom electrode 114. For example, if a voltage greater than zero volts is applied to the first node 118, current may flow from the top electrode 112, across the active layer 106, to the bottom electrode 114. In various embodiments, the group III-V device may be configured as a diode, such as, for example, a PiN diode.

In some embodiments, the substrate 102 and the buffer layer 104 each comprise a plurality of pillar structures 115. Sidewalls of the plurality of pillar structures 115 define a plurality of openings 116, such that the plurality of pillar structures 115 may be separated from one another by a corresponding opening in the plurality of openings 116. For example, the pillar structures 115 may be laterally separated from one another by a distance d1. In some embodiments, the distance d1 is non-zero. The bottom electrode 114 continuously extends along the sidewalls of the substrate 102 and the buffer layer 104 to a lower surface 106ls of the active layer 106. Further, the plurality of pillar structures 115 are distributed laterally across a width of the bottom electrode 114, such that the bottom electrode 114 may form an ohmic contact with the active layer 106 while the buffer layer 104 may compensate for the difference in lattice constants between the substrate 102 and the active layer 106. This in turn facilitates the bottom electrode 114 having a good electrical connection (i.e., an ohmic contact) with the active layer 106 while maintaining the strain in the crystal lattice of the active layer 106, thereby preventing dislocations within the active layer 106 and increasing a performance of the group III-V device (e.g., increasing a breakdown voltage of the group III-V device).

In further embodiments, the bottom electrode 114 comprises a conductive body 114a and a plurality of conductive structures 114b. The conductive body 114a continuously extends along a bottom surface of the substrate 102 and the plurality of conductive structures 114b each extend from the conductive body 114a along sidewalls of the substrate 102 and the buffer layer 104 to contact the lower surface 106ls of the active layer 106. The conductive structures 114b are laterally separated from one another by an adjacent pillar structure in the plurality of pillar structures 115. In some embodiments, the plurality of conductive structures 114b each have a U-shape.

Figure 2A:
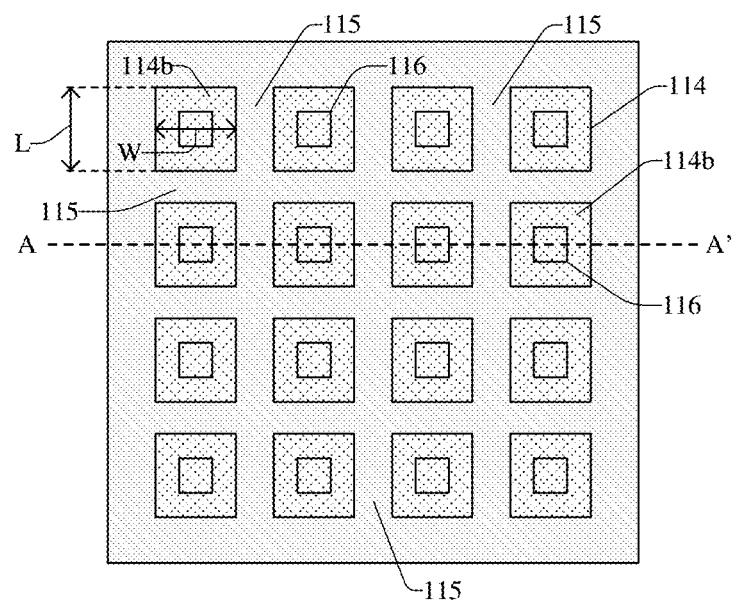
FIGS. 2A-D illustrate various top views of some alternative embodiments of the semiconductor device of FIG. 1 according to the line in FIG. 1.

FIG. 2A illustrates a top view 200a of some embodiments of the semiconductor structure 100 of FIG. 1 taken along line A-A'.

As illustrated in FIG. 2A, when viewed from above, the plurality of openings 116 may have a square shape, a rectangular shape, or the like. In further embodiments, the conductive structures 114b of the bottom electrode 114 may each comprise a same shape as the plurality of openings 116, such that the conductive structures 114b may have a rectangular prism shape. Further, the substrate 102 continuously laterally wraps around the conductive structures 114b, such that the pillar structures 115 laterally separate adjacent conductive structures 114b from one another. In some embodiments, a width W of each of the conductive structures 114b is less than about 0.2 micrometers. In further embodiments, if the width W is greater than about 0.2 micrometers, then the conductive structures 114b may each be too large such that the strain in the crystal lattice of the active layer (106 of FIG. 1) may be released and/or relaxed, thereby decreasing a breakdown voltage of the semiconductor structure (100 of FIG. 1). In yet further embodiments, the width W of the conductive structure 114b may be equal to a length L of the conductive structure 114b.

Figure 2B:
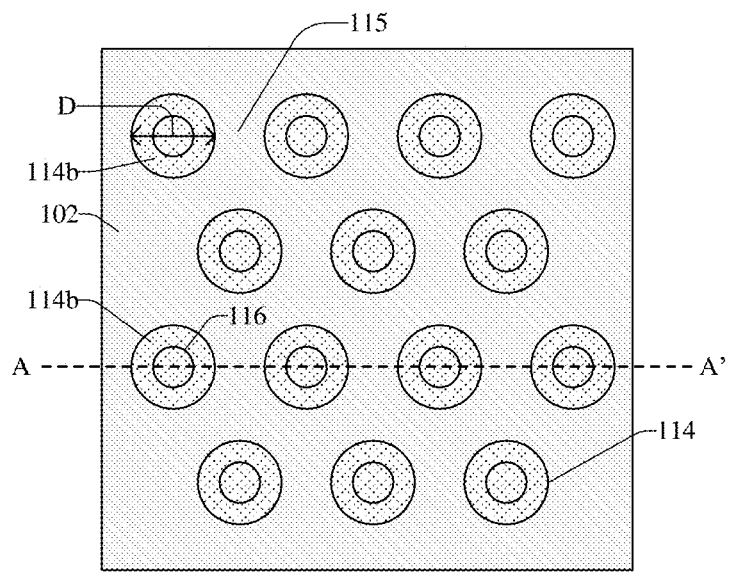

FIG. 2B illustrates a top view 200b of some alternative embodiments of the semiconductor structure 100 of FIG. 1 taken along line A-A'.

As illustrated in FIG. 2B, when viewed from above, the plurality of openings 116 may have a circular shape, an elliptical shape, or the like. In further embodiments, the conductive structures 114b of the bottom electrode 114 may each comprise a same shape as the plurality of openings 116, such that the conductive structures 114b may each have a cylinder shape. In some embodiments, a diameter D of each of the conductive structures 114b is less than about 0.2 micrometers. In further embodiments, if the diameter D is greater than about 0.2 micrometers, then the conductive structures 114b may each be too large such that the strain in the crystal lattice of the active layer (106 of FIG. 1) may be released and/or relaxed, thereby decreasing a breakdown voltage of the semiconductor structure (100 of FIG. 1).

Figure 2C:
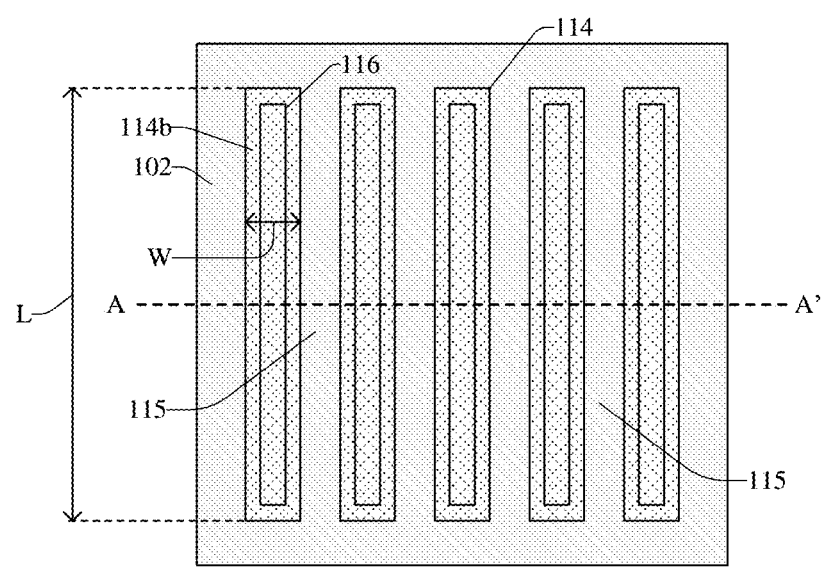

FIG. 2C illustrates a top view 200c of some alternative embodiments of the semiconductor structure 100 of FIG. 1 taken along line A-A'.

As illustrated in FIG. 2C, when viewed from above, the plurality of openings 116 may have a rectangular shape, or another suitable shape. In some embodiments, the conductive structures 114b of the bottom electrode 114 may each comprise a same shape as the plurality of openings 116, such that the conductive structures 114b may each have a rectangular prism shape. In some embodiments, a width W of each of the conductive structures 114b is less than about 0.2 micrometers. In further embodiments, if the width W is greater than about 0.2 micrometers, then the conductive structures 114b may each be too large such that the strain in the crystal lattice of the active layer (106 of FIG. 1) may be released and/or relaxed, thereby decreasing a breakdown voltage of the semiconductor structure (100 of FIG. 1). In yet further embodiments, the width W of the conductive structure 114b may be less than a length L of the conductive structure 114b, for example, the length L may be about 2, 4, 6, or 8 times greater than the width W.

Figure 2D:
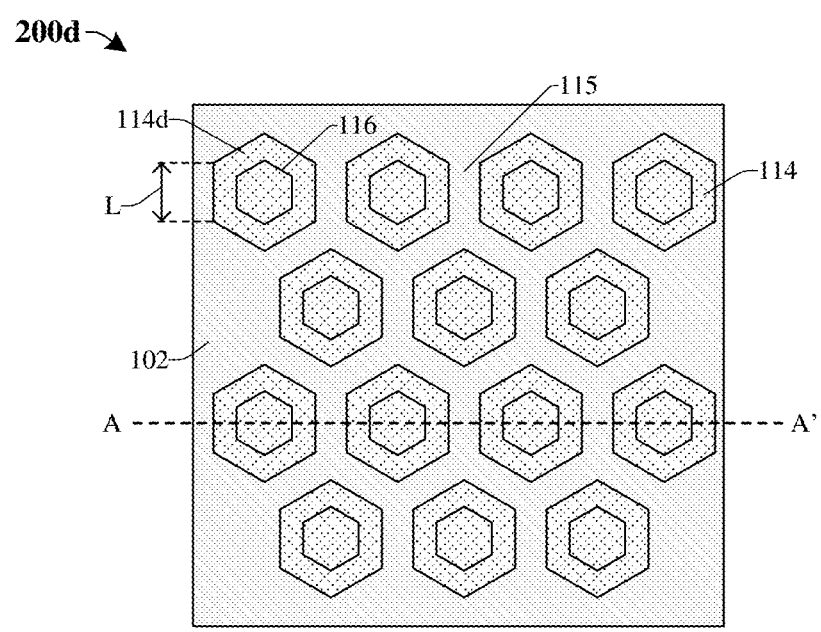

FIG. 2D illustrates a top view 200d of some alternative embodiments of the semiconductor structure 100 of FIG. 1 taken along line A-A'.

As illustrated in FIG. 2D, when viewed from above, the plurality of openings 116 may have a polygon shape, such as a hexagon shape, or another suitable shape. In some embodiments, the conductive structures 114b of the bottom electrode 114 may each comprise a same shape as the plurality of openings 116. In some embodiments, a length L of each side of the polygon shape of each conductive structure 114b is less than about 0.2 micrometers. In further embodiments, if the length L is greater than about 0.2 micrometers, then the conductive structures 114b may each be too large such that the strain in the crystal lattice of the active layer (106 of FIG. 1) may be released and/or relaxed, thereby decreasing a breakdown voltage of the semiconductor structure (100 of FIG. 1).

Figure 3A:
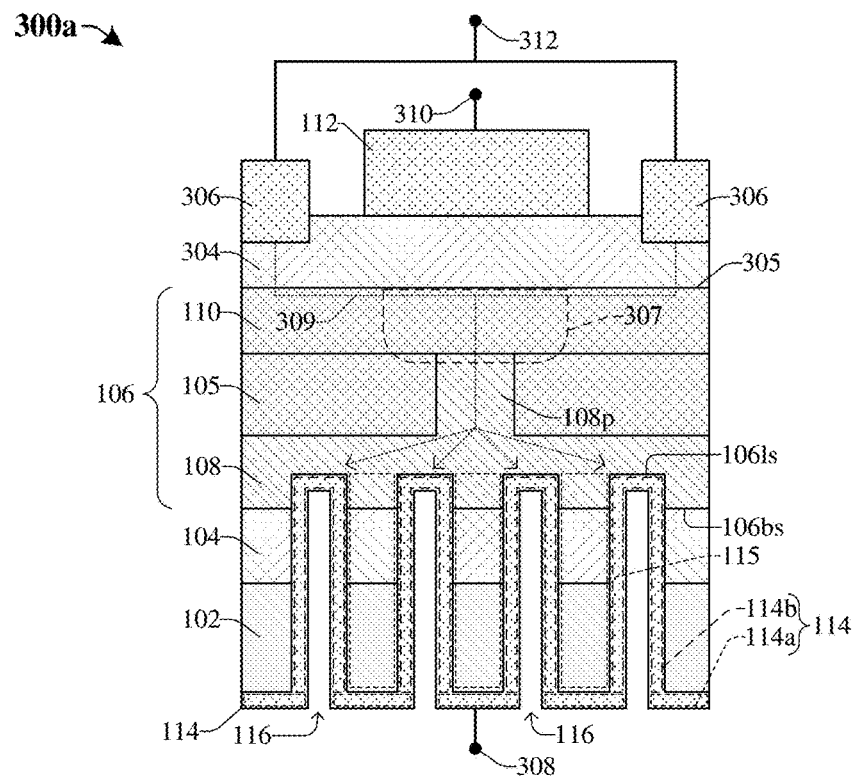
FIGS. 3A and 3B illustrate cross-sectional views of some alternative embodiments of a semiconductor device having an active layer disposed between a top electrode and a bottom electrode.

FIG. 3A illustrates a cross-sectional view of some embodiments of a semiconductor device 300a having an active layer 106 disposed over a substrate 102.

The semiconductor device 300a includes a buffer layer 104 disposed between the substrate 102 and the active layer 106. In some embodiments, the bottom electrode 114 extends through the substrate 102 and the buffer layer 104 to contact a lower surface 106ls of the active layer 106, such that the bottom electrode 114 forms an ohmic contact with the active layer 106. In some embodiments, the active layer 106 includes an undoped region 110, a first doped region 105, and a second doped region 108. In further embodiments, the second doped region 108 comprises a protrusion 108p that continuously extends through the first doped region 105 to the undoped region 110. In some embodiments, the first doped region 105 comprises a first doping type (e.g., p-type) and the second doped region 108 comprises a second doping type (e.g., n-type) opposite the first doping type. In further embodiments, the first doping type is p-type and the second doping type is n-type, or vice versa. In some embodiments, the undoped region 110 may be undoped such that the undoped region 110 may, for example, be or comprise an intrinsic region of a material the active layer 106 is comprised of, such as gallium nitride.

The semiconductor device 300a further includes an upper buffer layer 304 overlying the active layer 106. In some embodiments, the upper buffer layer 304 and the buffer layer 104 may each comprise a first group III-V material (e.g., $Al_xGa_{1-x}N$, where x is within a range of 0 to 1). In further embodiments, the active layer 106 comprises a second group III-V material (e.g., gallium nitride). In some embodiments, the first group III-V material is different than the second group III-V material. In some embodiments, the substrate 102 may, for example, be or comprise silicon, silicon carbide, sapphire, or another suitable semiconductor substrate material. The buffer layer 104 is configured to compensate for a lattice mismatch between the substrate 102 and the active layer 106. Further, the active layer 106 is formed over the buffer layer 104 in such a manner that a crystal lattice of the active layer 106 is strained, thereby increasing a mobility of charge carriers across the active layer 106. In some embodiments, the substrate 102 and the buffer layer 104 comprise a plurality of pillar structures 115 that are laterally spaced across a width of a bottom electrode 114, such that the pillar structures 115 may facilitate maintaining the strain of the crystal lattice of the active layer 106 in a region of the active layer 106 directly overlying the bottom electrode 114.

In some embodiments, a top electrode 112 overlies the upper buffer layer 304 and may be configured as a gate electrode of the semiconductor device 300a, the bottom electrode 114 may be configured as a first source/drain region electrode, and the upper electrode 306 may be configured as a second source/drain region electrode. Thus, the semiconductor device 300a may be configured as a vertical transistor. In further embodiments, the semiconductor device 300a may be operated in an enhancement mode, in which two-dimensional electron gas (2DEG) and/or two-dimensional hole gas (2DHG) may form along a heterojunction 305 between the upper buffer layer 304 and the undoped region 110 due to a difference in band gap between the undoped region 110 and the upper buffer layer 304. In some embodiments, the top electrode 112, the bottom electrode 114, and/or the upper electrode 306 may each, for example, be or comprise titanium, tantalum, titanium nitride, aluminum, copper, another suitable conductive material, or any combination of the foregoing.

In some embodiments, a gate electrode node 310 is electrically coupled to the top electrode 112, a drain node 308 is electrically coupled to the bottom electrode 114, and further a source node 312 is electrically coupled to the upper electrode 306. The aforementioned nodes may be electrically coupled to the respective electrodes by way of conductive wires and/or vias (not shown). By applying suitable bias conditions to the gate electrode node 310, the drain node 308, and/or the source node 312, charge carriers (e.g., electrons or holes) may travel from the upper electrode 306 to the bottom electrode 114 along, for example, the path 309. In yet further embodiments, the charge carries may travel along the heterojunction 305. In various embodiments, by applying the appropriate bias conditions to the gate electrode node 310 and/or the source node 312, a conductive channel may form within a depletion region 307 of the active layer 106, such that the charge carriers may travel along the conductive channel within the depletion region 307 to the second doped region 108. By virtue of the pillar structures 115 being laterally spaced across the width of the bottom electrode 114, the strain in the crystal lattice of the active layer 106 may be maintained, thereby increasing a breakdown voltage of the semiconductor device 300a.

Figure 3B:
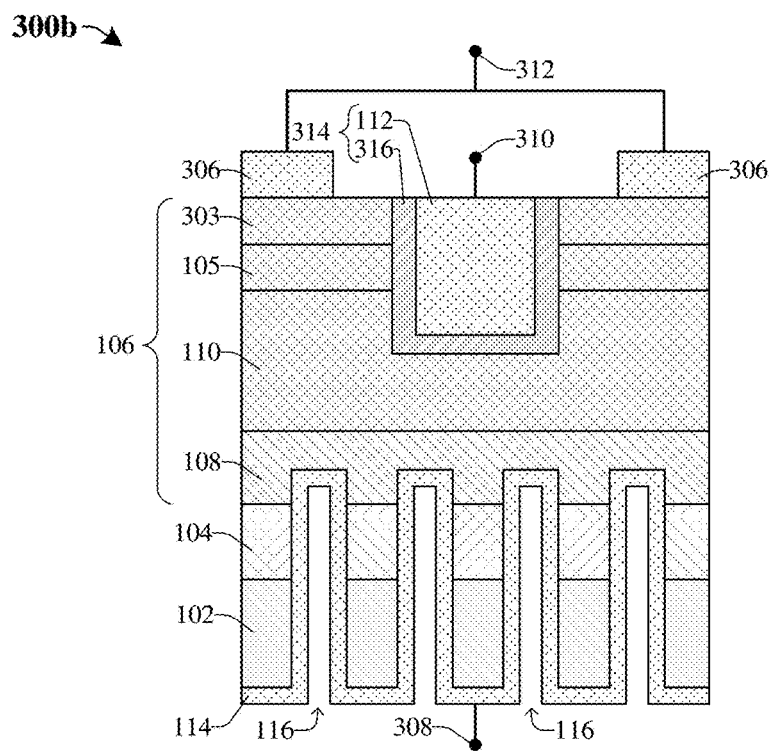

FIG. 3B illustrates a cross-sectional view of some embodiments of a semiconductor device 300b according to some alternative embodiments of the semiconductor device 300a of FIG. 3A.

In some embodiments, the semiconductor device 300b includes a gate structure 314 that includes the top electrode 112 surrounded by a gate dielectric layer 316. The top electrode 112 and the gate dielectric layer 316 may be disposed within a trench that extends through the active layer 106. In some embodiments, the gate dielectric layer 316 may, for example, be or comprise silicon dioxide, a high-k dielectric material, another suitable dielectric material, or any combination of the foregoing. The active layer 106 may include a first doped region 105, an undoped region 110, a second doped region 108, and a contact region 303. In some embodiments, the first doped region 105 may comprise a first doping type (e.g., p-type) and the second doped region 108 may comprise a second doping type (e.g., n-type) opposite the first doping type. In some embodiments, the first and second doped regions 105, 108 may have about a same doping concentration. The contact region 303 may comprise the second doping type (e.g., n-type) with a higher doping concentration than the first doped region 105 and/or the second doped region 108. In further embodiments, the undoped region 110 is undoped and may, for example, comprise intrinsic gallium nitride.

In some embodiments, the gate dielectric layer 316 continuously extends along sidewalls and a lower surface of the top electrode 112 and is configured to separate the top electrode 112 from the active layer 106. Further, during operation of the semiconductor device 300b, by applying appropriate bias conditions to the gate electrode node 310 and/or the source node 312, an electric field generated by the top electrode 112 may form a selectively conductive channel within the first doped region 105 and/or the undoped region 110. Thus, charge carriers (e.g., electrons) may travel from the upper electrode 306 to the second doped region 108 and/or the bottom electrode 114 along the selectively conductive channel.

Figure 4:
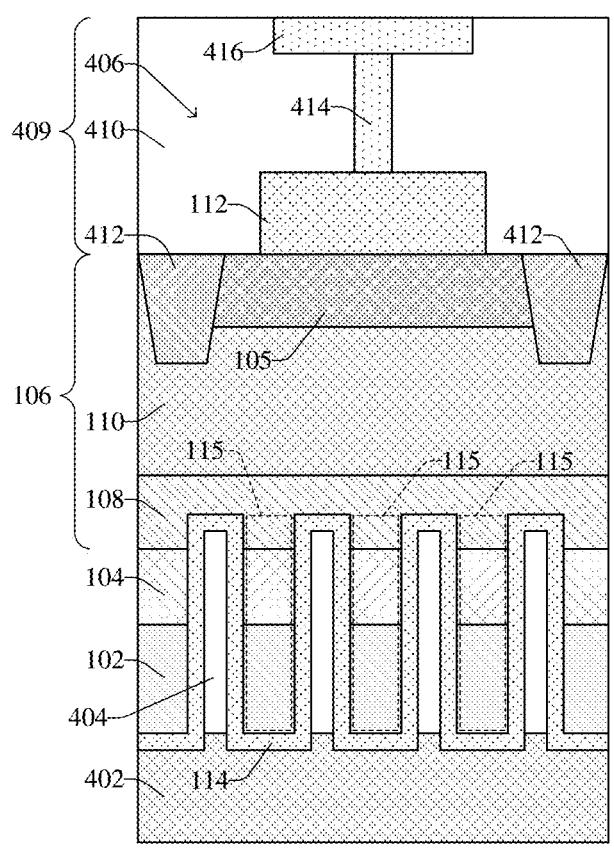
FIG. 4 illustrates a cross-sectional view of some embodiments of a semiconductor device including an interconnect structure overlying an active layer disposed between a top electrode and a bottom electrode.

FIG. 4 illustrates a cross-sectional view of some embodiments of an integrated chip 400 including an interconnect structure 409 overlying an active layer 106.

In some embodiments, the integrated chip 400 includes a substrate 102 underlying the active layer 106 and a semiconductor die 402 underlying the substrate 102. In some embodiments, the semiconductor die 402 may, for example, be an application-specific integrated circuit (ASIC), in which the semiconductor die 402 may include an ASIC interconnect structure overlying an ASIC substrate. One or more semiconductor devices (not shown) be disposed within/over the ASIC substrate. The substrate 102 may, for example, be or comprise monocrystalline silicon, silicon carbide, or some other semiconductor material, and/or may, for example have a crystalline orientation of (111) or some other crystalline orientation. Further, the substrate 102 may, for example, be a bulk substrate and/or may, for example, be a semiconductor wafer.

A buffer layer 104 overlies the substrate 102 and the active layer 106 overlies the buffer layer 104. In some embodiments, the buffer layer 104 may, for example, serve to compensate for difference in lattice constants, crystalline structures, thermal expansion coefficients, or any combination of the foregoing between the substrate 102 and the active layer 106. In further embodiments, the buffer layer comprises a first group III-V material having a first bandgap, and the active layer 106 comprises a second group III-V material having a second bandgap different from the first bandgap. For example, where the active layer 106 is gallium nitride (GaN), the buffer layer 104 may be aluminum gallium nitride (AlGaN), where AlGaN has a bandgap of about 4 electron volts (eV), whereas GaN has a bandgap of about 3.4 eV.

In some embodiments, the active layer 106 comprises a first doped region 105, a second doped region 108, and an undoped region 110 disposed between the first and second doped regions 105, 108. In some embodiments, the first doped region 105 may comprise a first doping type (e.g., p-type) and the second doped region 108 may comprise a second doping type (e.g., n-type) opposite the first doping type. In further embodiments, the first doping type is p-type and the second doping type is n-type, or vice versa. In some embodiments, the undoped region 110 may be undoped, such that the undoped region 110 may, for example, be or comprise intrinsic gallium nitride (GaN). A top electrode 112 overlies the active layer 106 and a bottom electrode 114 underlies the active layer 106. Thus, in some embodiments, a group III-V device 406 is disposed within/on the active layer 106. The group III-V device 406 may include the top electrode 112, the bottom electrode 114, the first doped region 105, the second doped region 108, and/or the undoped region 110. In further embodiments, the group III-V device 406 is configured as a diode, as described in FIG. 1. In some embodiments, an insulation structure 404 is disposed between sidewalls of the bottom electrode 114. In further embodiments, the insulation structure 404 may, for example, be or comprise air, a dielectric material, such as silicon dioxide, silicon nitride, a combination of the foregoing, or another suitable material.

In further embodiments, an isolation structure 412 is disposed within the active layer 106 and may laterally surround the first doped region 105. The isolation structure 412 may, for example, be or comprise air, a dielectric material, such as silicon dioxide, silicon nitride, silicon carbide, another suitable dielectric material, a combination of the foregoing, or the like. The isolation structure 412 may be configured as a shallow trench isolation (STI) structure, such that the isolation structure 412 electrically isolates the first doped region 105 from other devices and/or devices disposed on/within the active layer 106. The interconnect structure 409 overlies the active layer 106. The interconnect structure 409 may, for example, include an interconnect dielectric structure 410, one or more conductive vias 414, and/or one or more conductive wires 416. In some embodiments, the interconnect dielectric structure 410 may, for example, be or comprise a plurality of inter-level dielectric (ILD) layers. In further embodiments, the plurality of ILD layers may, for example, each be or comprise silicon dioxide, a low-k dielectric material, an extreme low-k dielectric material, a combination of the foregoing, or another suitable dielectric material. In further embodiments, the one or more conductive vias and/or wires 414, 416 may each be or comprise aluminum, copper, tungsten, titanium, a combination of the foregoing, or another suitable conductive material. In some embodiments, the interconnect structure 409 is configured to electrically couple the group III-V device 406 to other conductive layers and/or other semiconductor devices by way of, for example, another integrated chip (not shown).

In some embodiments, the buffer layer 104 and the substrate 102 comprise a plurality of pillar structures 115 that extend from the active layer 106 to the semiconductor die 402. The bottom electrode 114 extends laterally encloses the plurality of pillar structures 115 and extends along the pillar structures 115 to contact a lower surface of the active layer 106. Thus, the bottom electrode 114 may be configured to electrically couple the active layer 106 to the semiconductor die 402. In further embodiments, the bottom electrode 114 may be directly electrically coupled to the second doped region 108 and the top electrode 112 may be directly electrically coupled to the first doped region 105. In some embodiments, the bottom electrode 114 and/or the top electrode 112 may, for example, each be or comprise aluminum, copper, titanium, tungsten, tantalum, a combination of the foregoing, or another suitable conductive material.

FIGS. 5-12 illustrate various views 500-1200 of some embodiments of a method for forming a group III-V device having an active layer overlying a substrate. Although the various views 500-1200 shown in FIGS. 5-12 are described with reference to a method, it will be appreciated that the structures shown in FIGS. 5-12 are not limited to the method but rather may stand alone separate of the method. Further, although FIGS. 5-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
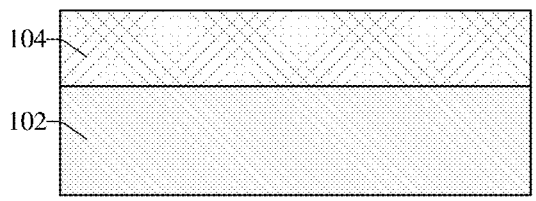
FIGS. 5-12 illustrate a series of various views of some embodiments of a method of forming a group III-V device having an active layer overlying a substrate.

As shown in cross-sectional view 500 of FIG. 5, a substrate 102 is provided and a buffer layer 104 is formed over the substrate 102. In some embodiments, the substrate 102 may, for example, be or comprise monocrystalline silicon, silicon carbide, or some other semiconductor material, and/or may, for example, have a crystalline orientation of (111) or some other crystalline orientation. In further embodiments, the buffer layer 104 may, for example, be or comprise aluminum gallium nitride ($Al_xGa_{x-1}N$), gallium nitride (GaN), or another suitable group III-V material. In some embodiments, x is within a range of about 0.01 to 0.5, 0.5 to 1, or 0 to 1. In some embodiments, the buffer layer 104 may, for example be deposited by chemical vapor deposition (CVD), physical vapor deposition (PVD), atomic layer deposition (ALD), metal organic chemical vapor deposition (MOCVD), or another suitable growth or deposition process. In further embodiments, the buffer layer 104 may be epitaxially formed. In yet further embodiments, the buffer layer 104 may be formed entirely by MOCVD.

Figure 6:
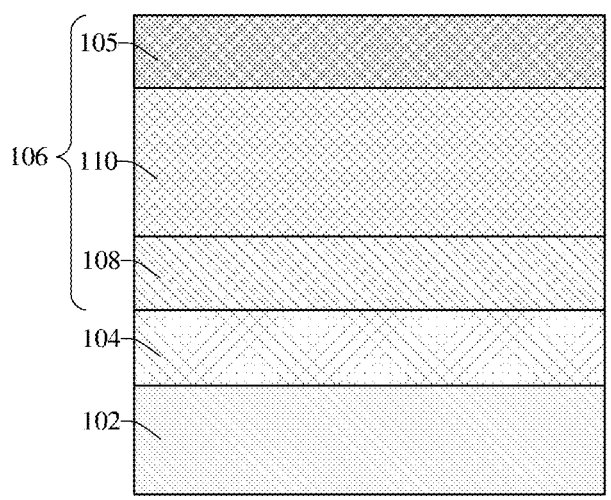

As shown in cross-sectional view 600 of FIG. 6, an active layer 106 is epitaxially formed over the buffer layer 104. The active layer 106 may be formed by, for example, molecular beam epitaxy (MBE), metal organic vapor phase epitaxy (MOVPE), some other vapor phase epitaxy (VPE), liquid phase epitaxy (LPE), some other suitable epitaxial process, or any combination of the foregoing. For example, in some embodiments, the active layer 106 may be entirely formed by MBE. In some embodiments, the active layer 106 may be doped before or after depositing the active layer 106 over the buffer layer 104, such that the active layer 106 comprises a first doped region 105 and a second doped region 108. In some embodiments, the first doped region 105 comprises a first doping type (e.g., p-type) and the second doped region 108 comprises a second doping type (e.g., n-type) opposite the first doping type. The active layer 106 is doped in such a manner that an undoped region 110 is disposed vertically between the first and second doped regions 105, 108. In some embodiments, the buffer layer 104 may, for example, serve to compensate for a different in lattice constants, crystalline structures, thermal expansion coefficients, or any combination of the foregoing between the substrate 102 and the active layer 106.

In some embodiments, before forming the active layer 106, the active layer 106 has an initial lattice constant that is different from a lattice constant of the buffer layer 104. As the active layer 106 is deposited over (e.g., by an epitaxial process) and/or bonded to the buffer layer 104, the initial lattice constant of the active layer 106 will conform to the lattice constant of the buffer layer 104, such that the active layer 106 has a strained crystal lattice with a strained lattice constant after being formed over and/or on the buffer layer 104. This strained lattice constant of the active layer 106 is less than the initial lattice constant of the active layer 106, thereby increasing a breakdown voltage of a type III-V device formed within and/or on the active layer 106.

Figure 7:
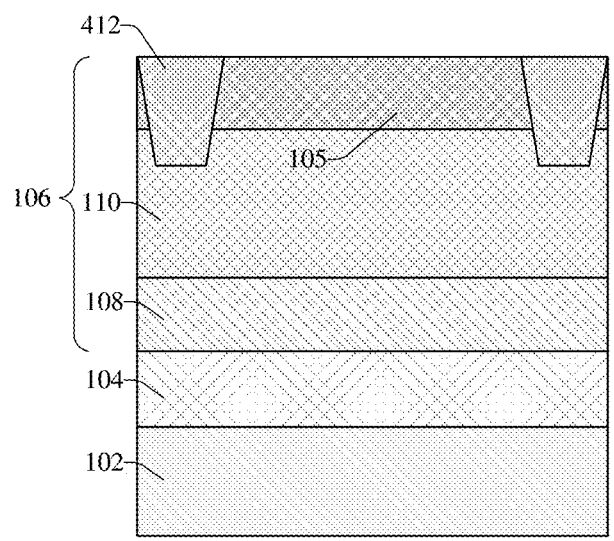

As shown in cross-sectional view 700 of FIG. 7, an isolation structure 412 is formed in the active layer 106. In some embodiments, a process for forming the isolation structure 412 may include: depositing a masking layer (not shown) over the active layer 106; patterning the active layer 106 according to the masking layer to define one or more openings; depositing a dielectric material in the one or more openings, thereby defining the isolation structure 412; and performing a removal process to remove the masking layer. In some embodiments, depositing the dielectric material may be omitted, such that the isolation structure 412 is omitted and/or comprises air.

Figure 8:
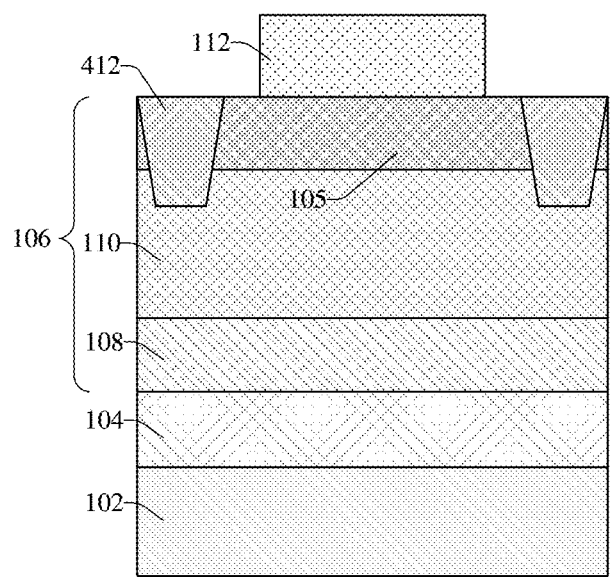

As shown in cross-sectional view 800 of FIG. 8, a top electrode 112 is formed over the active layer 106. In some embodiments, the top electrode 112 may, for example, be deposited by CVD, PVD, electroless plating, electro plating, or another suitable deposition or growth process.

Figure 9:
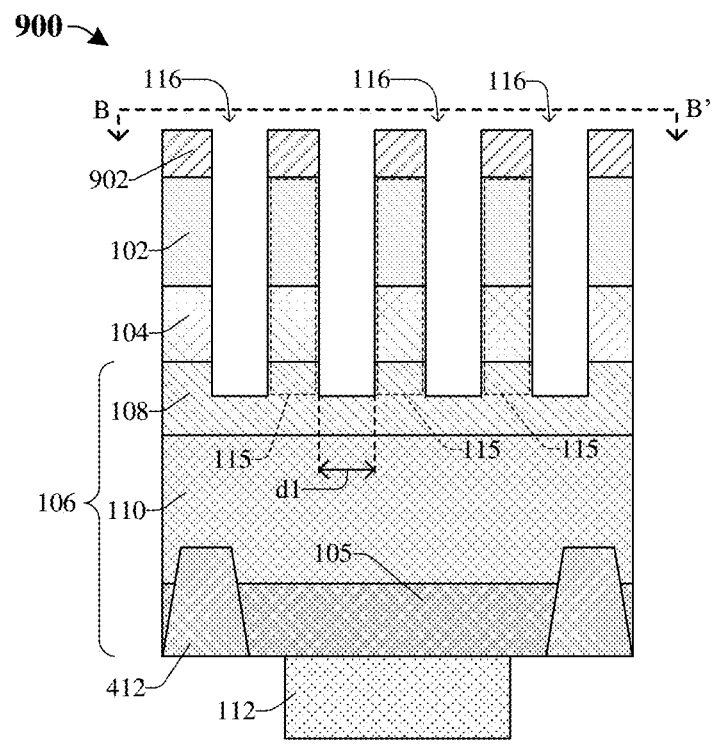

As shown in cross-sectional view 900 of FIG. 9, the structure of FIG. 8 is rotated and a masking layer 902 is formed over the substrate 102. In some embodiments, the masking layer 902 comprises a plurality of sidewalls that defines a plurality of openings. In further embodiments, the substrate 102 and/or the buffer layer 104 are patterned according to the masking layer 902, thereby defining a plurality of openings 116 and a plurality of pillar structures 115. In some embodiments, the patterning process includes exposing unmasked regions of the substrate 102 and/or the buffer layer 104 to one or more etchants until the active layer 106 is reached. In further embodiments, the patterning process over-etches and removes at least a portion of the active layer 106. In yet further embodiments, the patterning process is performed in such a manner that the undoped region 110 is not reached. In some embodiments, the plurality of pillar structures 115 are laterally offset from one another by a distance d1. The distance d1 may, for example, be non-zero. In further embodiments, the pillar structures 115 are configured to maintain the strained lattice constant of the active layer 106.

In some embodiments, because the patterning process performed on the substrate 102 and/or the buffer layer 104 defines the pillar structures 115, release and/or relaxation of the strained crystal lattice of the active layer 106 does not occur. Further, dislocations may not be formed within the active layer 106. In further embodiments, if the plurality of pillar structures 115 are omitted (not shown) and/or the plurality of openings 116 are a single large opening, then relaxation may occur in the strained crystal lattice of the active layer 106. This may increase a lattice constant of the active layer 106 to a value greater than the strained lattice constant and/or the resulting lattice constant of the active layer 106 does not conform to the lattice constant of the buffer layer 104. In such embodiments, this may reduce a breakdown voltage of a group III-V device formed within and/or on the active layer 106. Thus, by virtue of the pillar structures 115 maintaining the strained crystal lattice of the active layer 106, a performance of group III-V devices formed within and/or on the active layer 106 is increased.

Figure 10A:
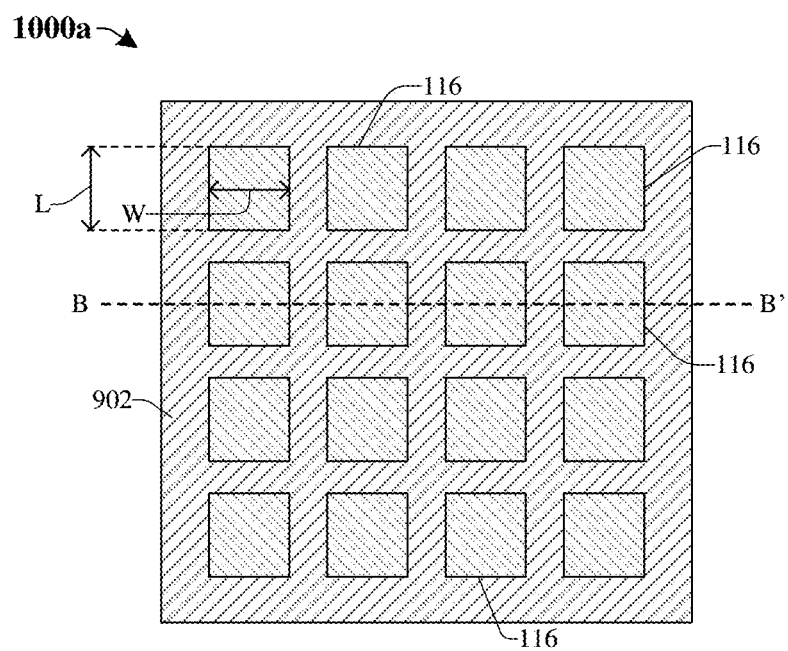

FIG. 10A illustrates a top view 1000a according to some alternative embodiments of the structure of FIG. 9 taken along the line B-B'. As illustrated in FIG. 10A, the plurality of openings 116 may each have a rectangular shape or a square shape. In further embodiments, the plurality of openings 116 are laterally offset from one another by a non-zero distance, such that the openings 116 are arranged in a discontinuous pattern and are not connected to one another. In some embodiments, a length L and/or a width W of each of the openings 116 are each less than about 0.2 micrometers. In further embodiments, if the width W and/or the length L are respectively greater than about 0.2 micrometers, then the openings 116 may each be too large such that the strain in the crystal lattice of the active layer (106 of FIG. 9) may be released and/or relaxed, thereby increasing a lattice constant of the active layer (106 of FIG. 9).

Figure 10B:
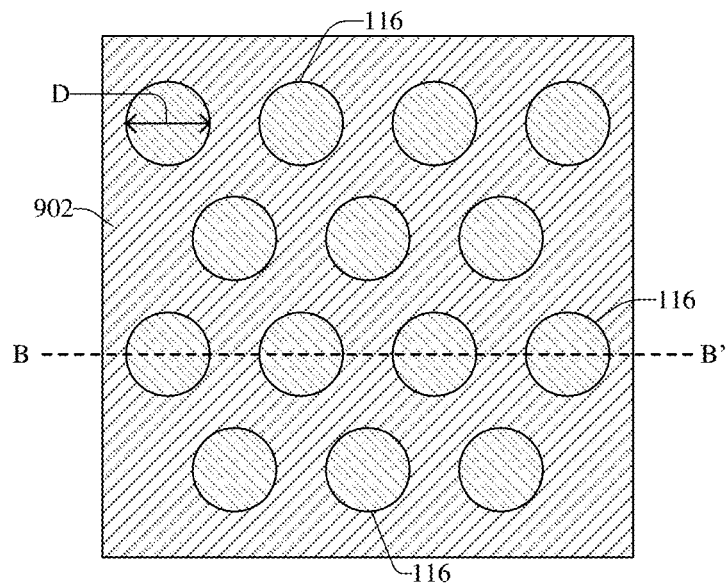

FIG. 10B illustrates a top view 1000b according to some alternative embodiments of the structure of FIG. 9 taken along the line B-B'. As illustrated in FIG. 10B, the plurality of openings 116 may each have a circular shape or an elliptic shape. In some embodiments, a diameter D of each of the openings 116 is less than about 0.2 micrometers. In further embodiments, if the diameter D is greater than about 0.2 micrometers, then the openings 116 may each be too large such that the strain in the crystal lattice of the active layer (106 of FIG. 9) may be released and/or relaxed, thereby increasing a lattice constant of the active layer (106 of FIG. 9).

Figure 10C:
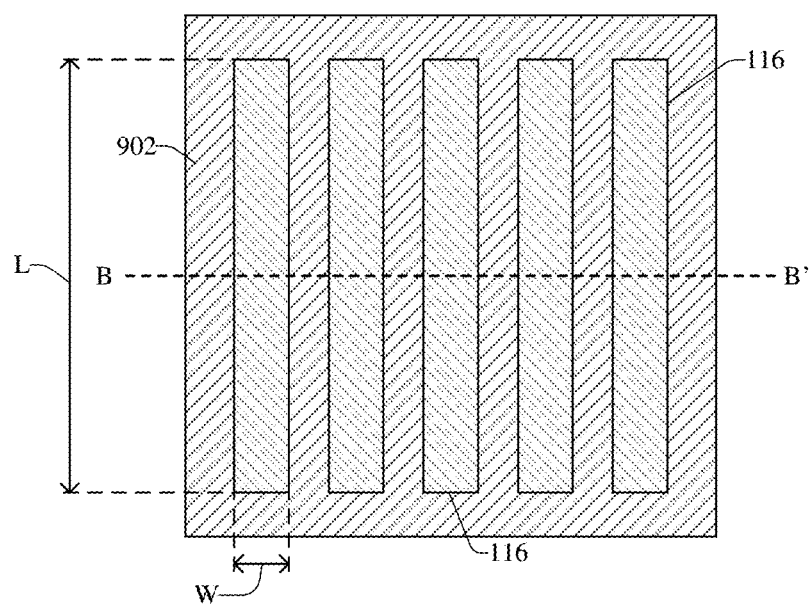

FIG. 10C illustrates a top view 1000c according to some alternative embodiments of the structure of FIG. 9 taken along the line B-B'. As illustrated in FIG. 10C, the plurality of openings 116 may each have an elongated rectangular shape, such that a length L of each opening 116 is greater than a width W of the opening 116. In some embodiments, the width W of each of the openings 116 is less than about 0.2 micrometers. In further embodiments, if the width W is greater than about 0.2 micrometers, then the openings 116 may each be too large such that the strain in the crystal lattice of the active layer (106 of FIG. 9) may be released and/or relaxed, thereby increasing a lattice constant of the active layer (106 of FIG. 9).

Figure 10D:
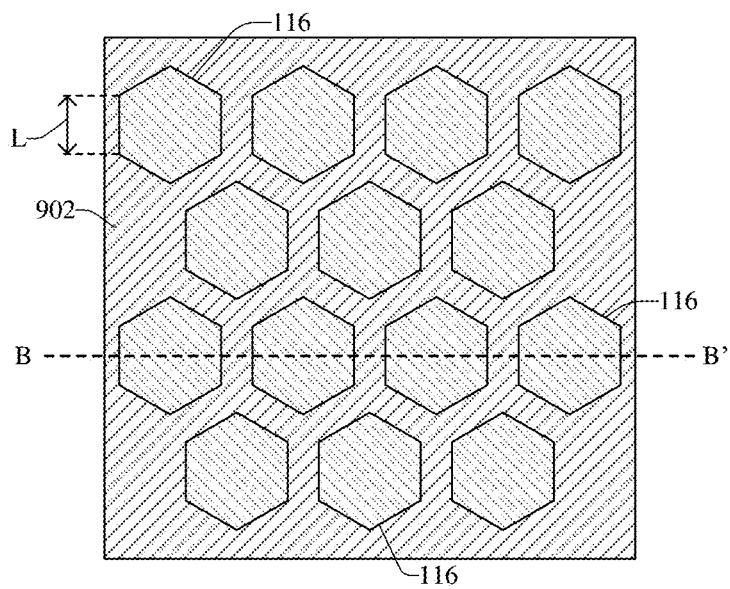

FIG. 10D illustrates a top view 1000d according to some alternative embodiments of the structure of FIG. 9 taken along the line B-B'. As illustrated in FIG. 10D, the plurality of openings 116 may each have a polygon shape, such as a hexagon shape, or another suitable shape. In some embodiments, a length L of each side of the polygon shape of each opening 116 is less than about 0.2 micrometers. In further embodiments, if the length L is greater than about 0.2 micrometers, then the openings 116 may each be too large such that the strain in the crystal lattice of the active layer (106 of FIG. 9) may be released and/or relaxed, thereby increasing a lattice constant of the active layer (106 of FIG. 9).

Figure 11:
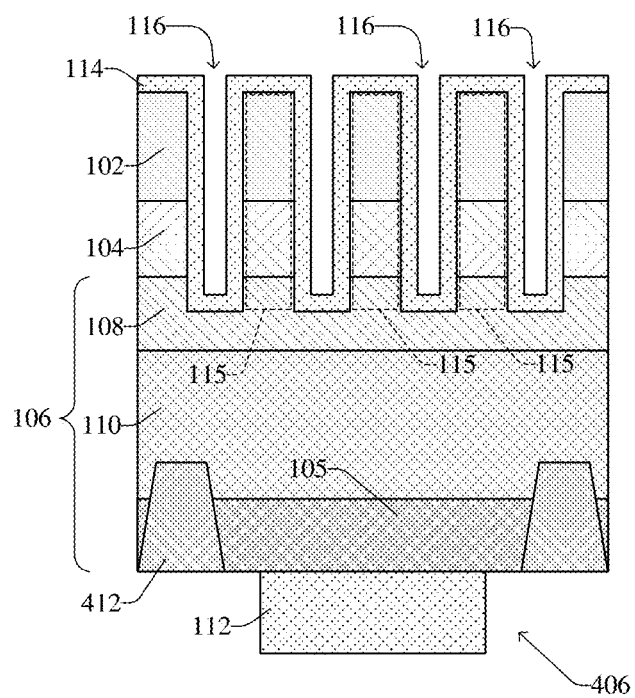

As shown in cross-sectional view 1100 of FIG. 11, a bottom electrode 114 is formed along the substrate 102, the buffer layer 104, and the active layer 106, such that the bottom electrode 114 at least partially fills the openings 116. This in part defines a group III-V device 406. In some embodiments, the bottom electrode 114 continuously extends between each opening in the plurality of openings 116 and directly contacts the active layer 106. In further embodiments, the bottom electrode 114 may, for example, be deposited by CVD, PVD, electroless plating, electro plating, or another suitable deposition or growth process.

Figure 12:
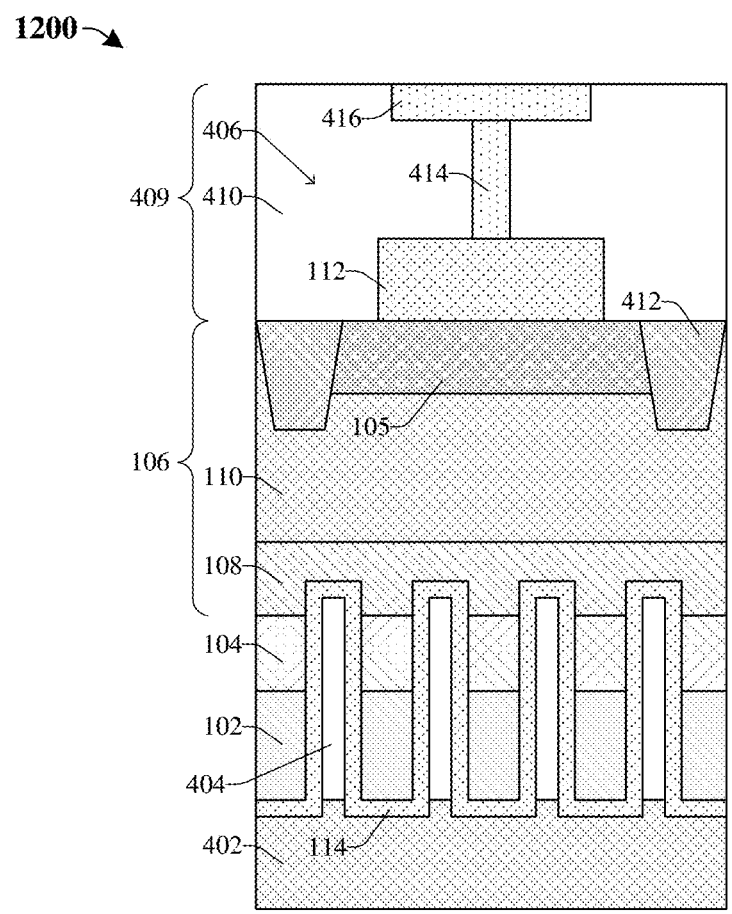

As shown in cross-sectional view 1200 of FIG. 12, the substrate 102 is bonded to a semiconductor die 402 and an interconnect structure 409 is formed along the active layer 106. In some embodiments, before bonding the substrate 102 to the semiconductor die 402, an insulation structure 404 is formed between sidewalls of the bottom electrode 114. Further, after forming the insulation structure 404, the substrate 102 is bonded to the semiconductor die 402. In some embodiments, the bonding process may include performing a eutectic bond, a fusion bond, and/or a hybrid bond. In further embodiments, bonding the substrate 102 to the semiconductor die 402, the structure is rotated and the interconnect structure 409 is formed over the active layer 106. In some embodiments, the interconnect structure 409 includes an interconnect dielectric structure 410, one or more conductive vias 414, and/or one or more conductive wires 416. In some embodiments, the interconnect dielectric structure 410 may be formed by one or more deposition processes, such as CVD, PVD, ALD, or another suitable growth or deposition process. In yet further embodiments, the one or more conductive vias 414 and/or the one or more conductive wires 416 may be formed by a single damascene process or a dual damascene process.

Figure 13:
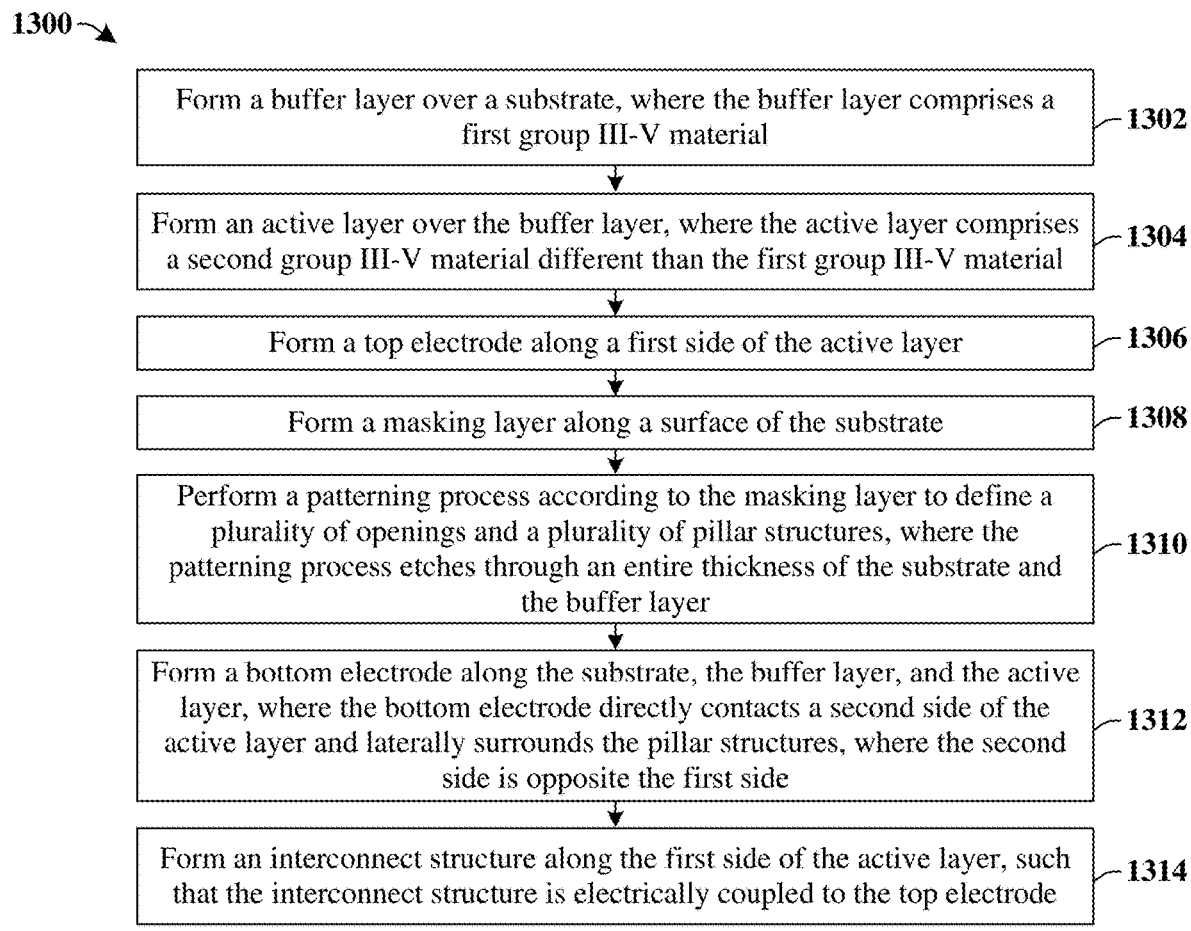
FIG. 13 illustrates a block diagram of some embodiments of a method of forming a group III-V device having an active layer overlying a substrate.

FIG. 13 illustrates a method 1300 for forming a group III-V device having an active layer overlying a substrate according to the present disclosure. Although the method 1300 illustrates and/or describes a series of acts or events, it will be appreciated that the method 1300 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a buffer layer is formed over a substrate, where the buffer layer comprises a first group III-V material. FIG. 5 illustrates a cross-sectional view 500 corresponding to some embodiments of act 1302.

At act 1304, an active layer is formed over the buffer layer. The active layer comprises a second group III-V material different from the first group III-V material. FIG. 6 illustrates a cross-sectional view 600 corresponding to some embodiments of act 1304.

At act 1306, a top electrode is formed along a first side of the active layer. FIG. 8 illustrates a cross-sectional view 800 corresponding to some embodiments of act 1306.

At act 1308, a masking layer is formed along a surface of the substrate. FIG. 9 illustrates a cross-sectional view 900 corresponding to some embodiments of act 1308.

At act 1310, a patterning process is performed according to the masking layer to define a plurality of openings and a plurality of pillar structures. The patterning process etches through an entire thickness of the substrate and the buffer layer. FIG. 9 illustrates a cross-sectional view 900 corresponding to some embodiments of act 1310.

At act 1312, a bottom electrode is formed along the substrate, the buffer layer, and the active layer, where the bottom electrode directly contacts a second side of the active layer and laterally surrounds the pillar structures. The second side is opposite the first side. FIG. 11 illustrates a cross-sectional view 1100 corresponding to some embodiments of act 1312.

At act 1314, an interconnect structure is formed along the first side of the active layer, such that the interconnect structure is electrically coupled to the top electrode. FIG. 12 illustrates a cross-sectional view 1200 corresponding to some embodiments of act 1314.

Accordingly, in some embodiments, the present disclosure relates to a semiconductor structure including a buffer layer overlying a substrate and an active layer overlying the buffer layer. The buffer layer and the substrate comprise a plurality of pillar structures that extend from a bottom surface of the active layer to a point below the bottom surface of the active layer. A bottom electrode is disposed along a lower surface of the active layer and extends along the plurality of pillar structures, such that the plurality of pillar structures are laterally spaced across a width of the bottom electrode.

In some embodiments, the present application provides a semiconductor structure, including a substrate; an active layer overlying the substrate; a buffer layer disposed between the substrate and the active layer, wherein the substrate and the buffer layer include a plurality of pillar structures that extend vertically from a bottom surface of the active layer in a direction away from the active layer; a top electrode overlying an upper surface of the active layer; and a bottom electrode underlying the substrate, wherein the bottom electrode includes a conductive body and a plurality of conductive structures that respectively extend continuously from the conductive body, along sidewalls of the pillar structures, to a lower surface of the active layer.

In some embodiments, the present application provides a semiconductor device including a substrate comprising a first material; an active layer overlying the substrate and comprising a first group III-V material different than the first material; a buffer layer overlying the substrate and comprising a second group III-V material different than the first material and the first group III-V material, wherein the buffer layer and the substrate include a plurality of pillar structures that extend from a bottom surface of the active layer to a point below the bottom surface of the active layer; a top electrode directly contacting a top surface of the active layer; and a bottom electrode underlying the active layer, wherein the bottom electrode laterally surrounds each pillar structure in the plurality of pillar structures, wherein the bottom electrode is disposed laterally between adjacent pillar structures in the plurality of pillar structures, and wherein the bottom electrode directly contacts a lower surface of the active layer.

In some embodiments, the present application provides a method for forming a semiconductor device, the method includes forming a buffer layer over a substrate, wherein the buffer layer comprises a first group III-V material; forming an active layer over the buffer layer, wherein the active layer comprises a second group III-V material different than the first group III-V material; forming a top electrode along a first surface of the active layer; patterning the buffer layer and the substrate to define a plurality of openings and a plurality of pillar structures, such that the pillar structures are laterally offset from one another by a respective opening in the plurality of openings, wherein the patterning process exposes a second surface of the active layer, wherein the second surface is opposite the first surface; and forming a bottom electrode along the substrate, the buffer layer, and the active layer, wherein the bottom electrode directly contacts the second surface of the active layer, wherein the bottom electrode laterally surrounds each pillar structure in the plurality of pillar structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
an active layer overlying the substrate;
a buffer layer disposed between the substrate and the active layer, wherein the substrate and the buffer layer comprise a plurality of pillar structures that extend vertically from a bottom surface of the active layer in a direction away from the active layer;
a top electrode overlying an upper surface of the active layer; and
a bottom electrode underlying the substrate, wherein the bottom electrode comprises a conductive body and a plurality of conductive structures that respectively extend continuously from the conductive body, along sidewalls of the pillar structures, to a lower surface of the active layer, wherein a height of a first conductive structure in the plurality of conductive structures is greater than a first width of a first pillar structure in the plurality of pillar structures.

2. The semiconductor structure of claim 1, wherein the bottom surface of the active layer is vertically offset from the lower surface of the active layer by a non-zero distance.

3. The semiconductor structure of claim 1, wherein the bottom electrode directly contacts the active layer and forms an ohmic contact with the active layer.

4. The semiconductor structure of claim 1, wherein the active layer comprises a first group III-V material and the buffer layer comprises a second group III-V material different from the first group III-V material.

5. The semiconductor structure of claim 1, wherein the conductive structures respectively comprise opposing elongated vertical conductive segments and a horizontal conductive segment, wherein the horizontal conductive segment extends continuously between the opposing elongated vertical conductive segments, wherein the horizontal conductive segment continuously extends along the lower surface of the active layer, and wherein the elongated vertical conductive segments respectively continuously extend along a sidewall of the substrate to a sidewall of the buffer layer.

6. The semiconductor structure of claim 1, wherein the pillar structures are laterally offset from one another by an adjacent conductive structure in the plurality of conductive structures.

7. The semiconductor structure of claim 1, wherein the plurality of pillar structures are laterally spaced between outer sidewalls of the bottom electrode.

8. The semiconductor structure of claim 1, wherein the active layer comprises:
 a first doped region comprising a first doping type; and
 a second doped region comprising a second doping type opposite the first doping type, wherein the first doped region overlies at least a portion of the second doped region.

9. The semiconductor structure of claim 1, wherein a vertical thickness of the buffer layer is greater than the first width.

10. The semiconductor structure of claim 1, further comprising:
 an upper buffer layer disposed between the active layer and the top electrode, wherein the upper buffer layer comprises a same material as the buffer layer;
 an undoped region disposed within the active layer, wherein the undoped region contacts the upper buffer layer;
 a first doped region disposed within the active layer and underlying the undoped region, wherein the first doped region comprises a first doping type; and
 a second doped region disposed within the active layer and underlying the undoped region, wherein the second doped region comprises a second doping type opposite the first doping type, wherein the second doped region comprises a protrusion that extends through the first doped region to contact the undoped region.

11. A semiconductor device, comprising:
 a substrate comprising a first material;
 an active layer overlying the substrate and comprising a first group III-V material different than the first material;
 a buffer layer overlying the substrate and comprising a second group III-V material different than the first material and the first group III-V material, wherein the buffer layer and the substrate comprise a plurality of pillar structures that extend from a bottom surface of the active layer to a point below the bottom surface of the active layer;
 a top electrode overlying the active layer;
 a bottom electrode underlying the active layer, wherein the bottom electrode laterally surrounds each pillar structure in the plurality of pillar structures, wherein the bottom electrode is disposed laterally between adjacent pillar structures in the plurality of pillar structures, and wherein the bottom electrode directly contacts a lower surface of the active layer; and
 an upper buffer layer disposed between the active layer and the top electrode, wherein the upper buffer layer comprises the second group III-V material.

12. The semiconductor device of claim 11, wherein the plurality of pillar structures comprise a first pillar structure and a second pillar structure that are laterally offset from one another by a non-zero distance, wherein the bottom electrode continuously extends from a sidewall of the first pillar structure to a sidewall of the second pillar structure, wherein the bottom electrode directly contacts the active layer along the non-zero distance.

13. The semiconductor device of claim 12, wherein the bottom electrode directly contacts a bottom surface of the first pillar structure and directly contacts a bottom surface of the second pillar structure.

14. The semiconductor device of claim 11, wherein the first material is silicon, the first group III-V material is gallium nitride, and the second group III-V material is aluminum gallium nitride.

15. The semiconductor device of claim 11, wherein the bottom electrode comprises a plurality of sidewalls that defines a plurality of openings.

16. The semiconductor device of claim 15, wherein the openings are rectangular when viewed from above.

17. The semiconductor device of claim 15, wherein when viewed from above the bottom electrode continuously surrounds respective ones of the plurality of openings.

18. A semiconductor structure, comprising:
 a semiconductor substrate comprising a first semiconductor material;
 an active layer overlying the semiconductor substrate, wherein the active layer comprises a second semiconductor material different than the first semiconductor material, wherein the active layer comprises a first doped region overlying a second doped region, wherein the first doped region comprises a first doping type and the second doped region comprises a second doping type opposite the first doping type, wherein the second doped region comprises a protrusion that extends through the first doped region;
 a top electrode overlying the active layer, wherein the protrusion is spaced laterally between sidewalls of the top electrode;
 a buffer layer disposed along a bottom surface of the active layer; and
 a bottom electrode underlying the semiconductor substrate, wherein the bottom electrode comprises a plurality of conductive structures disposed within the semiconductor substrate and the buffer layer, wherein the conductive structures contact the second doped region.

19. The semiconductor structure of claim 18, further comprising:
 an upper buffer layer overlying the active layer, wherein the upper buffer layer comprises the second semiconductor material.

20. The semiconductor structure of claim 1, wherein the height of the first conductive structure is greater than a sum of the first width and a second width of a second pillar structure in the plurality of pillar structures.

* * * * *